(12) United States Patent
Hayakawa

(10) Patent No.: US 8,801,450 B2
(45) Date of Patent: Aug. 12, 2014

(54) SOCKET HAVING A ROTATABLE LATCH WITH A PRESSING PORTION AND A DEPRESSING PORTION

(75) Inventor: Kenji Hayakawa, Saitama (JP)

(73) Assignee: Enplas Corporation, Saitama (JP)

( * ) Notice: Subject to any disclaimer, the term of this patent is extended or adjusted under 35 U.S.C. 154(b) by 49 days.

(21) Appl. No.: 13/634,455

(22) PCT Filed: Mar. 30, 2012

(86) PCT No.: PCT/JP2012/058526
§ 371 (c)(1),
(2), (4) Date: Sep. 12, 2012

(87) PCT Pub. No.: WO2012/133740
PCT Pub. Date: Oct. 4, 2012

(65) Prior Publication Data
US 2013/0280938 A1    Oct. 24, 2013

(30) Foreign Application Priority Data

Mar. 31, 2011 (JP) ................................ 2011-077763
Dec. 28, 2011 (JP) ................................ 2011-288137

(51) Int. Cl.
*H01R 13/62* (2006.01)
(52) U.S. Cl.
USPC ........................................................ 439/331
(58) Field of Classification Search
USPC ............................... 439/331, 372, 68, 73, 266
See application file for complete search history.

(56) References Cited

U.S. PATENT DOCUMENTS

| 5,228,866 | A | 7/1993 | Espenshade et al. | |
| 5,364,284 | A | 11/1994 | Tohyama et al. | |
| 5,823,794 | A * | 10/1998 | Abe | 439/73 |
| 6,666,691 | B2 * | 12/2003 | Ikeya | 439/71 |
| 6,776,641 | B2 * | 8/2004 | Hachuda | 439/331 |
| 6,848,928 | B2 * | 2/2005 | Ikeya et al. | 439/331 |

(Continued)

FOREIGN PATENT DOCUMENTS

| JP | 1-104684 | 7/1989 |
| JP | 6-36843 | 2/1994 |

(Continued)

OTHER PUBLICATIONS

PCT/IB/311, mailed Oct. 4, 2012, for corresponding International Application No. PCT/JP2012/058526.

(Continued)

*Primary Examiner* — Chandrika Prasad
(74) *Attorney, Agent, or Firm* — Staas & Halsey LLP

(57) ABSTRACT

An IC socket includes a socket body, a contact pin that contacts a terminal of an IC package, and a latch that presses the IC package from an upper side thereof. An elastic piece of the contact pin is extended along substantially horizontal direction. The latch is formed with a can portion. When the latch is rotated in an opening direction thereof, the elastic piece is pressed by the cam portion so as to be elastically deformed downward so that the contact portion is displaced to be separated downward from a contacting position to the terminal of the IC package. When the latch is rotated in a closing direction thereof, a pressing force of the cam portion applied to the elastic piece is released so as to displace the cam portion upward by the elastic force of the elastic piece to thereby contact the terminal of the IC package.

4 Claims, 15 Drawing Sheets

(56) References Cited

U.S. PATENT DOCUMENTS

| | | |
|---|---|---|
| 2013/0171842 A1* | 7/2013 | Hayakawa ............ 439/68 |
| 2013/0171855 A1* | 7/2013 | Hayakawa ............ 439/331 |
| 2013/0171861 A1* | 7/2013 | Hayakawa ............ 439/372 |

FOREIGN PATENT DOCUMENTS

| | | |
|---|---|---|
| JP | 6-60951 | 3/1994 |
| JP | 7-282932 | 10/1995 |
| JP | 2002-343520 | 11/2002 |
| JP | 2002-343522 | 11/2002 |
| JP | 2007-59117 | 3/2007 |
| WO | WO 2012/133740 | 10/2012 |

OTHER PUBLICATIONS

International Search Report mailed Jun. 19, 2012 for corresponding International Application No. PCT/JP2012/058526.
International Search Report, PCT/ISA/210, of PCT/JP2012/058526 mailed Jun. 19, 2012.
PCT/ISA/237 of PCT/JP2012/058526 Jun. 19, 2012.

* cited by examiner

SOCKET HAVING A ROTATABLE LATCH WITH A PRESSING PORTION AND A DEPRESSING PORTION

CROSS-REFERENCE TO RELATED APPLICATIONS

This application is a U.S. National Phase application of PCT/JP2012/058526 filed Mar. 30, 2012 and claims the priority benefit of Japanese Application No. 2011-077763 filed Mar. 31, 2011 and Japanese Application No. 2011-288137 filed Dec. 28, 2011 in the Japanese Intellectual Property Office, the contents of both of which are incorporated herein by reference.

TECHNICAL FIELD

The present invention relates to a socket for electric parts disposed on a circuit board and adapted to accommodate electric parts for carrying out a performance test or like of the electric parts such as semiconductor device (called "IC package" hereinafter).

BACKGROUND TECHNOLOGY

As such a socket for electric parts of the kind mentioned above, there is conventionally known an IC socket used for performing a test for an IC package as disclosed, for example, in Patent Document 1.

This IC socket is located to be vertically movable in a state such that a floating plate for accommodating an IC package into a socket body is being urged upward. In addition, so-called horse-shoe-shaped contact pins are arranged to the socket body. The contact pins are formed with contact portions respectively contacting terminal portions formed to a lower surface of a peripheral edge portion of the IC package, and each of the contact portions is formed to a front end portion of an elastic piece extending substantially along the horizontal direction.

Further, latches each having a pressing portion are provided for the socket body to be pivotal, and when the latches are closed, the pressing portions of the latches abut against an upper surface of the IC package so as to press the same. On the contrary, when the latches are opened, the IC package is retired from an area in or from which the IC package is accommodated or taken out.

In addition, an operating member is disposed to the socket body to be vertically movable in an upwardly urged state, and when the operating member is moved downward, the latches are pressed to rotate the same in a direction to be opened. On the other hand, when the operating member is moved upward, the latches are rotated in a direction to be closed.

PRIOR ART DOCUMENT

Patent Document

Patent Document 1: Japanese Patent Application Laid-open No. 2007-59117

SUMMARY OF THE INVENTION

Problems to be Solved by the Invention

In the conventional structure mentioned above, the IC package is mounted on the floating plate, and in the state in which the contact portions of the contact pins contact the lower surface of the IC package, the IC package is pressed downward and then lowered by the closing latches. The contact portions of the contact pins are thereby displaced so as to provide a circular arc shape. Thus, each contact portion slides on the corresponding terminal portion of the IC package, thereby forming wiping trail or track to the terminal portion, and in a case where the terminal portions have narrow widths, the contact portions of the contact pins may adversely deviate from the terminal portions of the IC package.

In addition, since the latch also slides on the upper surface of the IC package, there is also a fear of forming a trail on the upper surface thereof.

Furthermore, there may cause a case where the contact portions of the contact pins and the IC package are strongly stuck together, and even if a strong urging force of the floating plate is applied, it may be difficult to pull off them from each other, thus being inconvenient.

Still furthermore, the structure comprising the floating plate, the socket body and the contact pin may provide such a problem as that it is difficult to ensure a positional accuracy necessary for positioning the IC package in consideration of tolerance of these members.

Then, an object of the present invention is to provide a socket for electric parts capable of suppressing generation of wiping trail of a terminal portion of an electric parts and generation of trail on an upper surface of the electric parts during an operation, reducing the number of parts or components, and improving positional accuracy of the electric parts now accommodated in the socket.

Means for Solving the Problem

In order to achieve the object mentioned above, the present invention provides a socket for electric parts including: a socket body that accommodates an electric parts having a lower surface to which a terminal is provided; a contact pin provided for the socket body and formed with an elastic piece comprising a contact portion to contact the terminal of the electric parts; and a latch provided for the socket body to be rotatable about a rotation shaft and configured to press the electric parts accommodated in the socket body from an upper side thereof, wherein the elastic piece of the contact pin is extended substantially along a horizontal direction, the latch is formed with a pressing portion, and when the latch is rotated in an opening direction thereof, the elastic piece is pressed downward by the pressing portion so as to be elastically deformed downward so that the contact portion is displaced downward to be separated downward from a contacting position to the terminal of the electric parts, and when the latch is rotated in a closing direction thereof, the electric parts is pressed from an upper side to thereby release a pressing force of the pressing portion applied to the elastic piece so as to displace the contact portion upward by the elastic force of the elastic piece to thereby contact the terminal of the electric parts.

Another characteristic feature of the present invention may reside in that a pair of the rotating shafts are concentrically disposed and a cam portion as the pressing portion is provided between the rotating shafts.

Effects of the Invention

According to the present invention, when the electric parts is accommodated in the socket for the electric parts, the latches are rotated in their opening direction, the elastic pieces of the contact pins are displaced downward, and thereafter, the electric parts is accommodated and the elastic pieces are displaced upward so that the contact portions of the contact pins are thereby contacted to the terminals of the electric parts. This structure differs from conventional structure in that any wiping is hardly caused and wiping trail or trace is hardly generated to the terminals of the electric parts. That is, so-called, pin-point contact can be realized. Accordingly, in addition to no generation of the wiping trail to the terminal of the electric parts, the contact pin is surely contacted to the terminal having extremely narrow width without being deviated.

Further, since the latch hardly slides while pressing the upper surface of the electric parts, any wiping trail is hardly caused on the upper surface of the electric parts.

Still furthermore, when the inspection of the electric parts is completed and the electric parts is required to be taken out, the latches are opened, and the elastic pieces of the contact pins are forcibly displaced downward by the pressing portions of the latches, and accordingly, the sticking of the contact portion of the contact pin and the terminal of the electric parts can be surely prevented.

In addition, since it is not necessary to vertically move the placing seat portion (accommodation surface portion) of the electric parts, there is no need for locating any floating plate. Consequently, the number of components or parts to be located can be reduced, and an considerable influence of tolerance of the respective components can be small. Furthermore, lateral vibration or like, which is possible on the flat plane on the floating plate, can be prevented, so that the electric parts can be more arranged to the predetermined position more precisely.

BEST MODE FOR CARRYING OUT THE INVENTION

Figure 1:
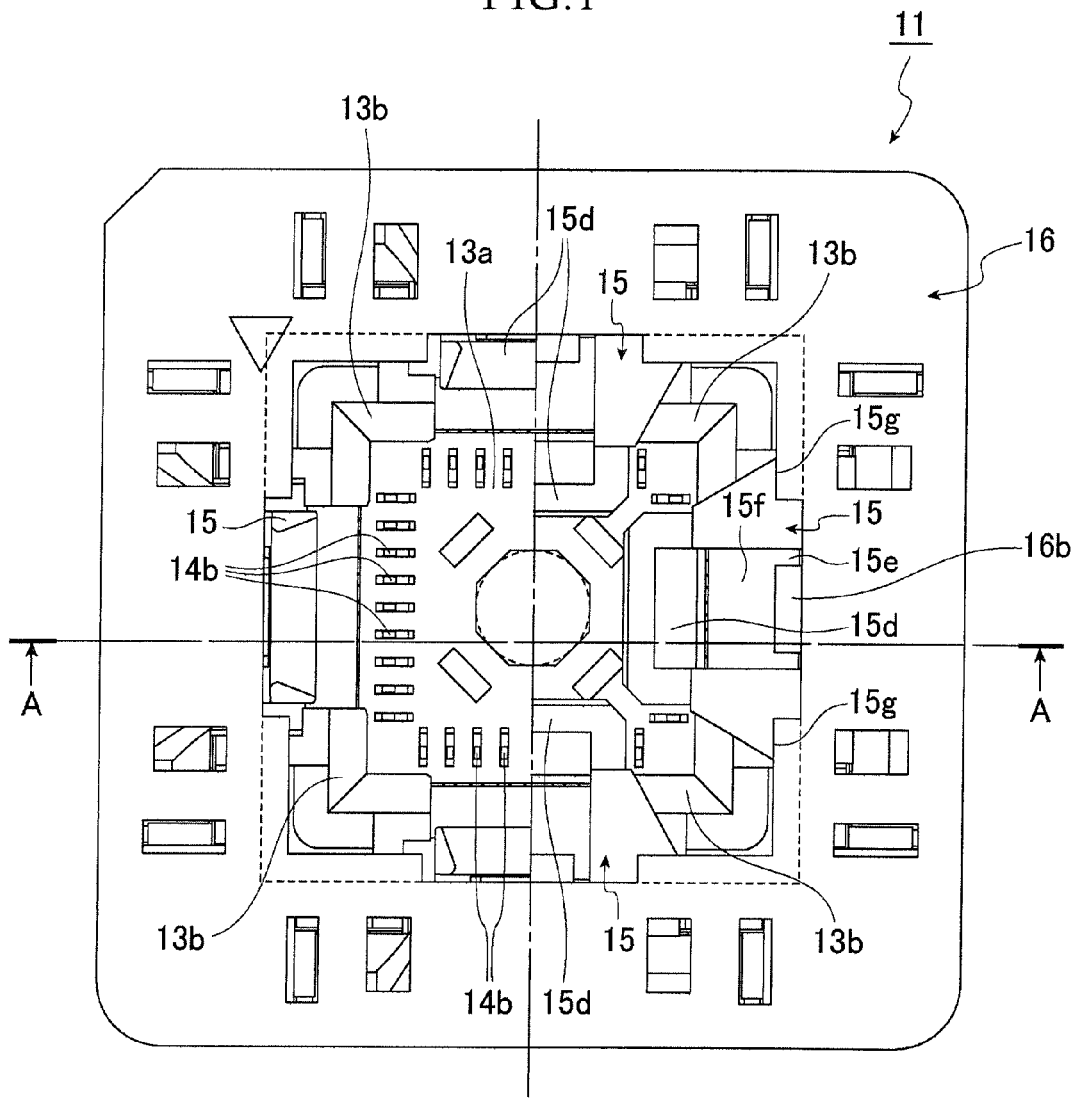
FIG. 1 is a plan view of an IC socket according to an embodiment of the present invention.

Hereunder, an embodiment of the present invention will be described.

FIGS. 1 to 15 represent one embodiment of the present invention.

Structure or configuration of the present embodiment will be first described hereunder, in which reference numeral 11 denotes an IC socket as "socket for electric parts", and the IC socket 11 is disposed on a circuit board, not shown, and is a component for establishing an electric connection between a terminal 12b of an IC package 12 as the "electric parts" and the circuit board for the purpose of performing burn-in test or like of the IC package and the like.

Figure 15:
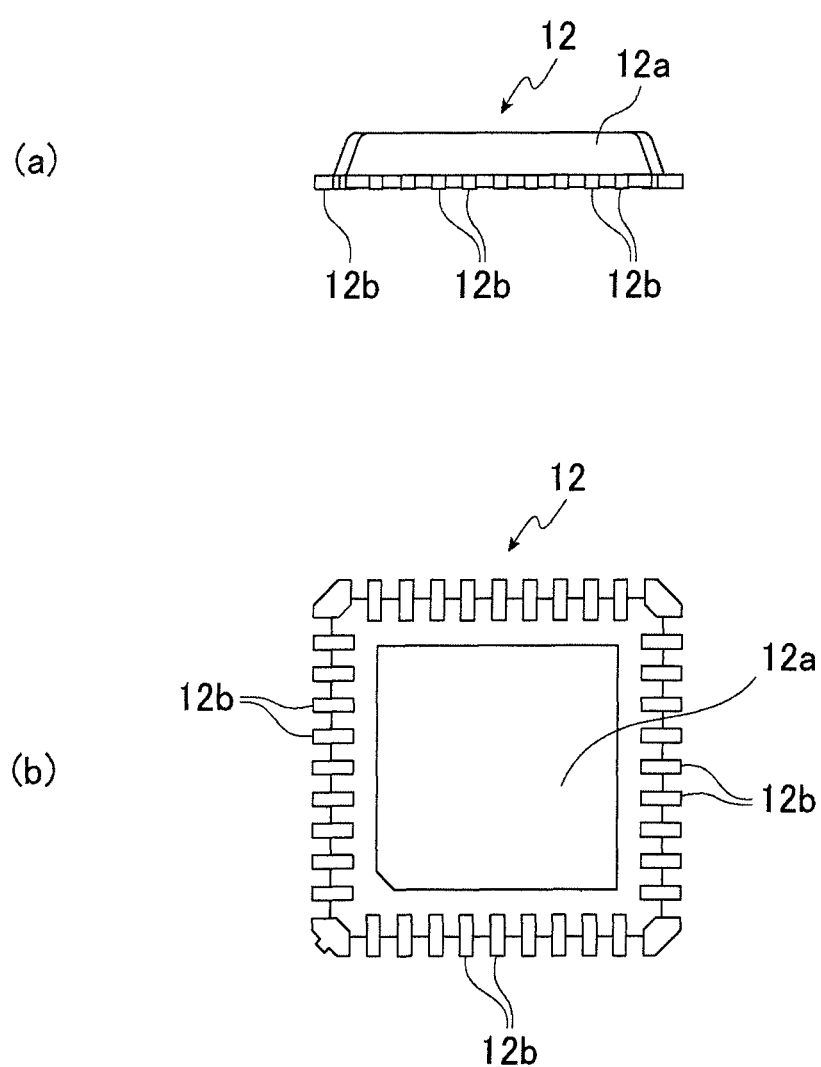
FIG. 15 illustrates the IC package and includes (a) being a front view of the IC package and (b) being a bottom view of the IC package.

The IC package 12 has a package body 12a having a rectangular shape in a plan view as shown in FIG. 15, and a plurality of terminals 12b are disposed to four sides of the lower surface of the peripheral edge of the package body 12b.

Figure 2:
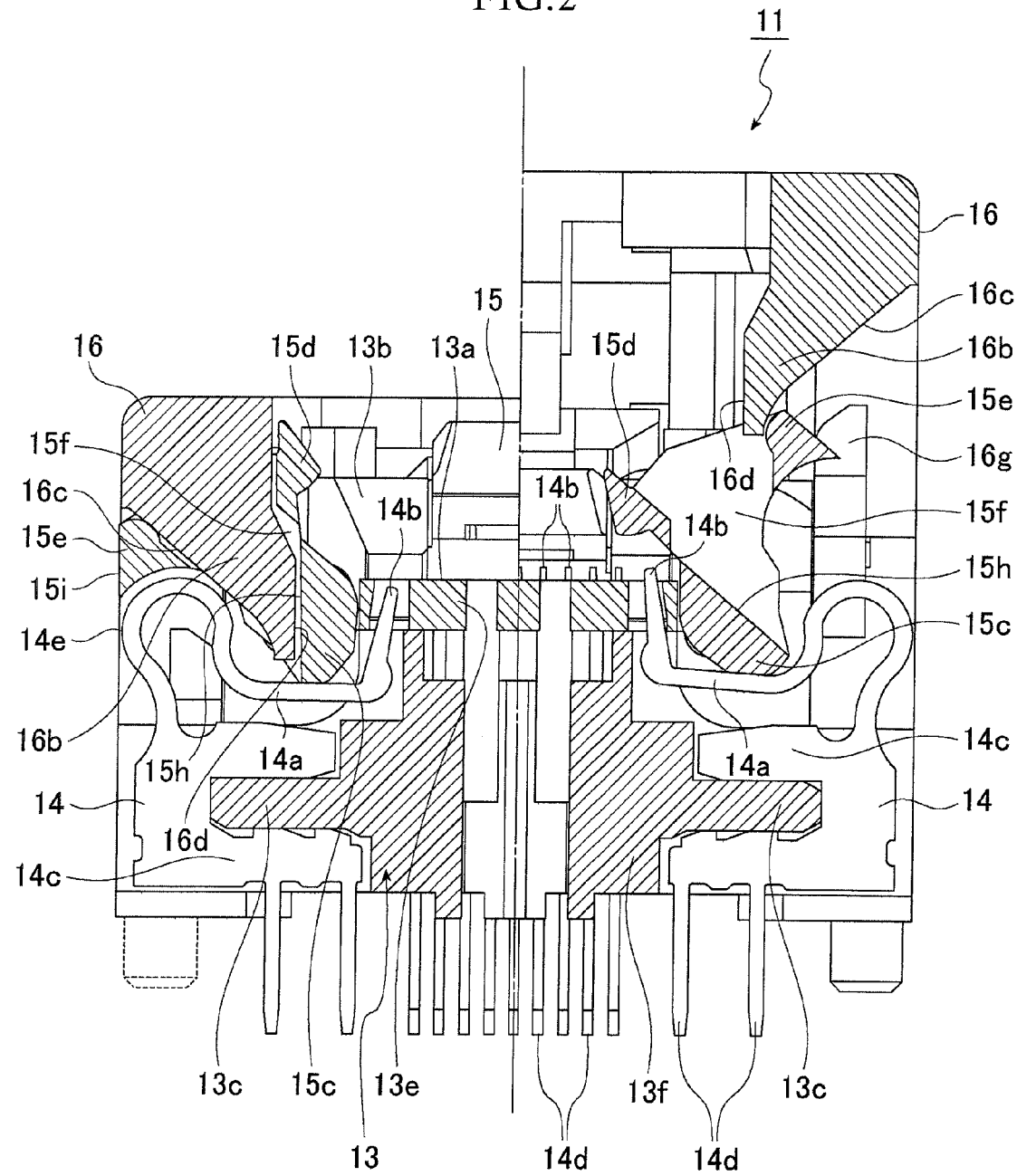
FIG. 2 is a sectional view taken along the line A-A in FIG. 1 according to the embodiment.
Figure 3:
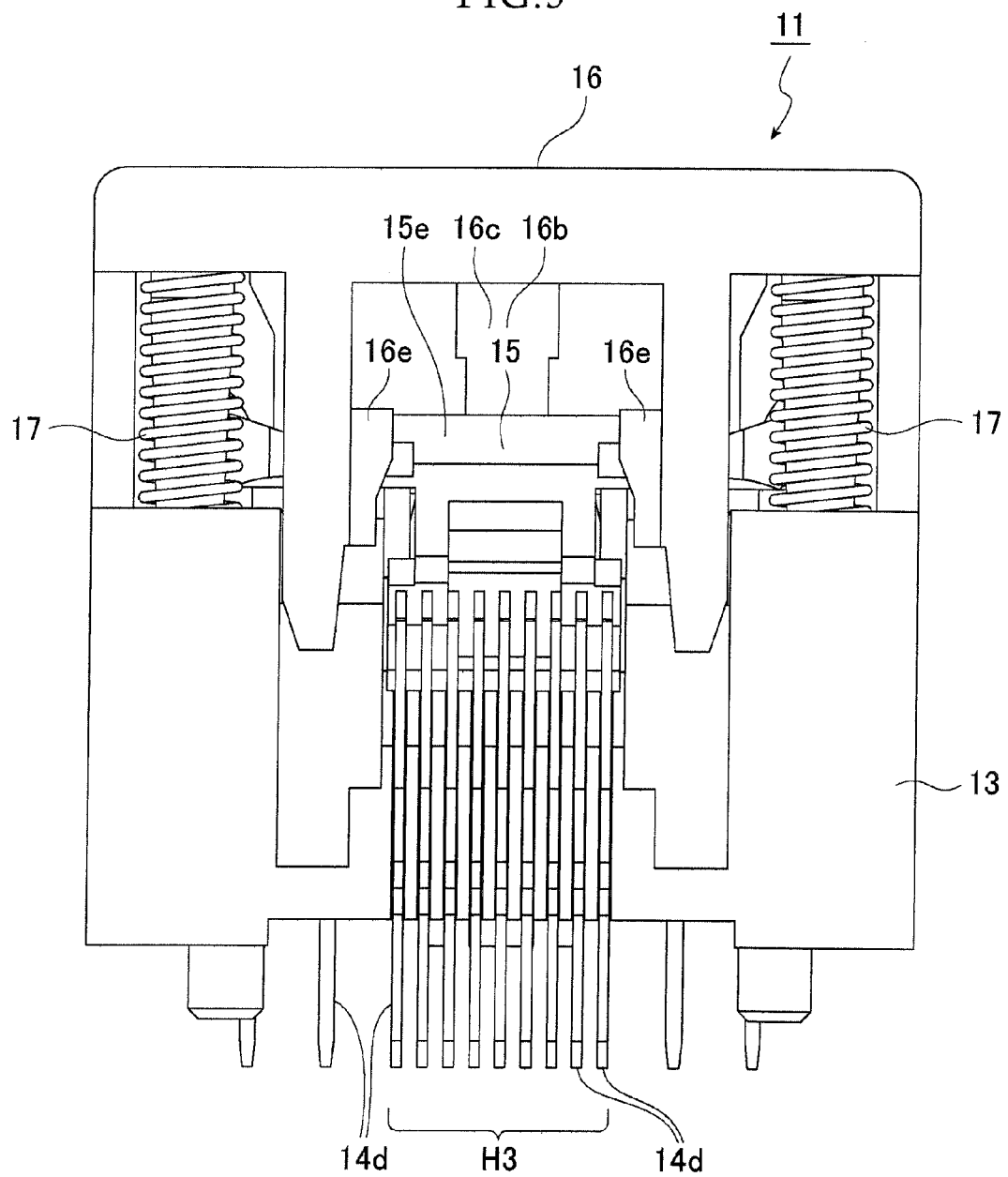
FIG. 3 is a view of the IC socket as viewed from the right side in FIG. 1.

On the other hand, the IC socket 11 is provided with, as shown in FIGS. 1 and 2, a socket body 13 having an accommodation surface portion on which the IC package 12 is accommodated, contact pins 14 provided for the socket body 13 and having elastic pieces 14a formed with contact portions contacting terminals 12b of the IC package 12, latches 15 pressing the IC package 12, from the upper side thereof, accommodated in the socket body 13 to be vertically movable, and an operating member 16 provided for the socket body 13 to be vertically movable. When the operating member 16 is operated to be moved downward, the latches 15 are rotated (pivoted) in an opening direction, and on the other hand, when the operating member 16 is moved upward, the larches 15 are rotated in a closing direction.

Figure 8:
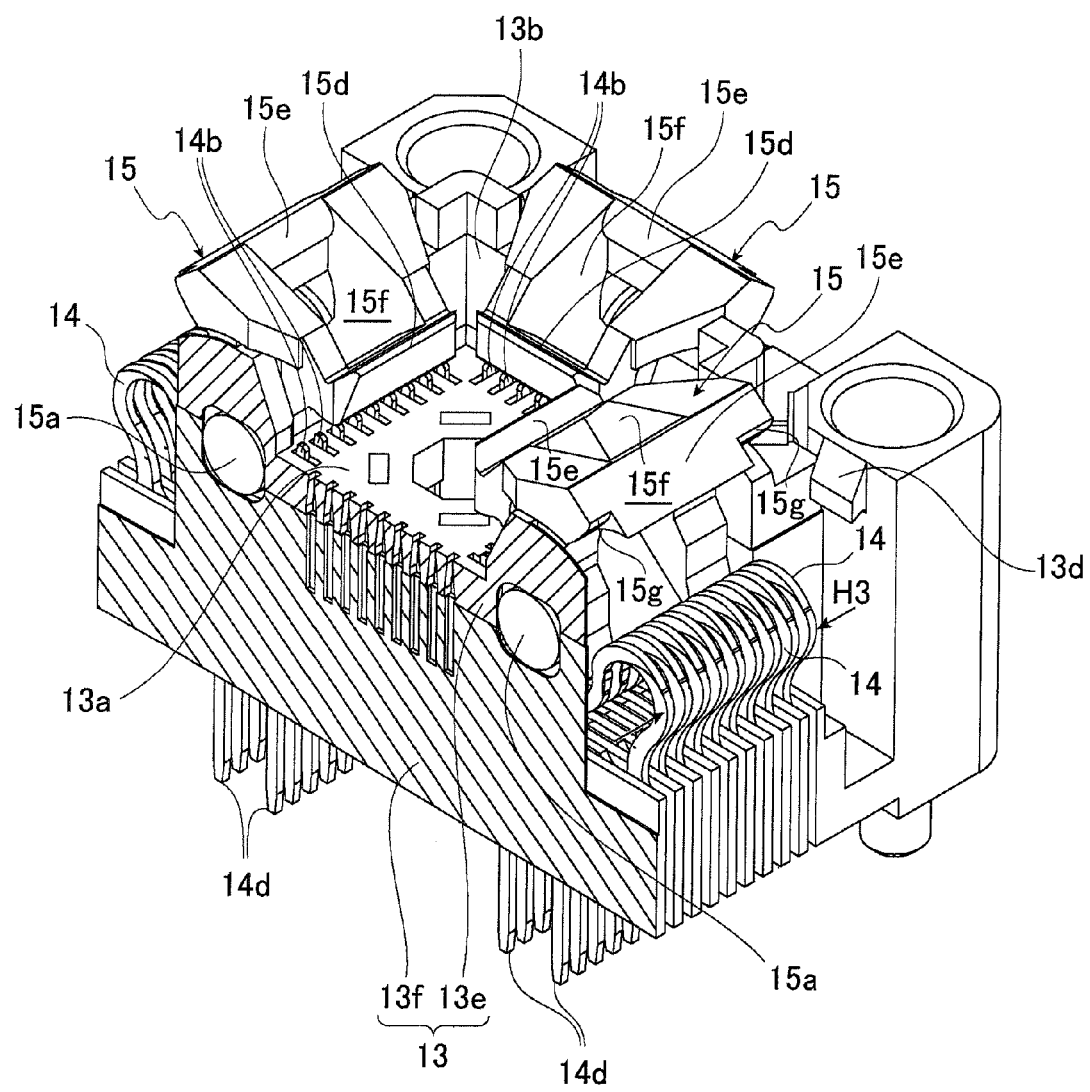
FIG. 8 is a perspective view of the IC socket, partially cut away, showing a state in which the operating member of the IC socket according to the present embodiment is removed.

The socket body 13 is formed of a synthetic resin material, and as shown, for example, in FIG. 1 and FIG. 8, composed of an upper side member 13e and a lower side member 13f. The upper side member 13e has an upper surface portion formed with the accommodation surface portion 13a having peripheral four corner portions to which guide portions 13b for guiding the IC package when accommodated are formed so as to project upward. On the other hand, the lower side member 13f of the socket body 13 provided with mount portions 13c so as to project in four directions as shown in FIG. 2, for example, and a plurality of contact pins 14 are attached to the mount portions 13c to be detachable from the horizontal side.

Further, each of the contact pins 14 is formed of a metal material having conductivity in so-called horseshoe-shape, and as shown in FIG. 2, each of the contact pin 14 has a clamp portion 14c so as to clamp the mount portion 13c, projecting horizontally from the socket body 13, from the vertical sides thereof to be detachable. According to such structure, the contact pin 14 is detachably mounted to the mount portion 13c of the socket body 13 from the side direction.

Furthermore, as shown in FIG. 2, each of the contact pin 14 has a structure in which the elastic piece 14a extends upward from the outer side end portion of the mount portion 13c, and then bent inward so as to substantially horizontally extend, and the contact portion 14b is formed so as to extend upward from the front end portion of the elastic piece 14a in a manner such that the contact portion 14b contacts a corresponding terminals 12b of the IC package 12. The contact pins 14 are provided with lead portions 14d extending downward from the clamp portions 14c thereof, and the lead portions 14d are inserted into the printed circuit board, not shown, and then are soldered to be fixed thereto.

In this way, the contact pins 14 are arranged at four side portions of the peripheral edge of the socket body 13 to be in parallel with each other and adjacently at a predetermined pitch.

Figure 9:
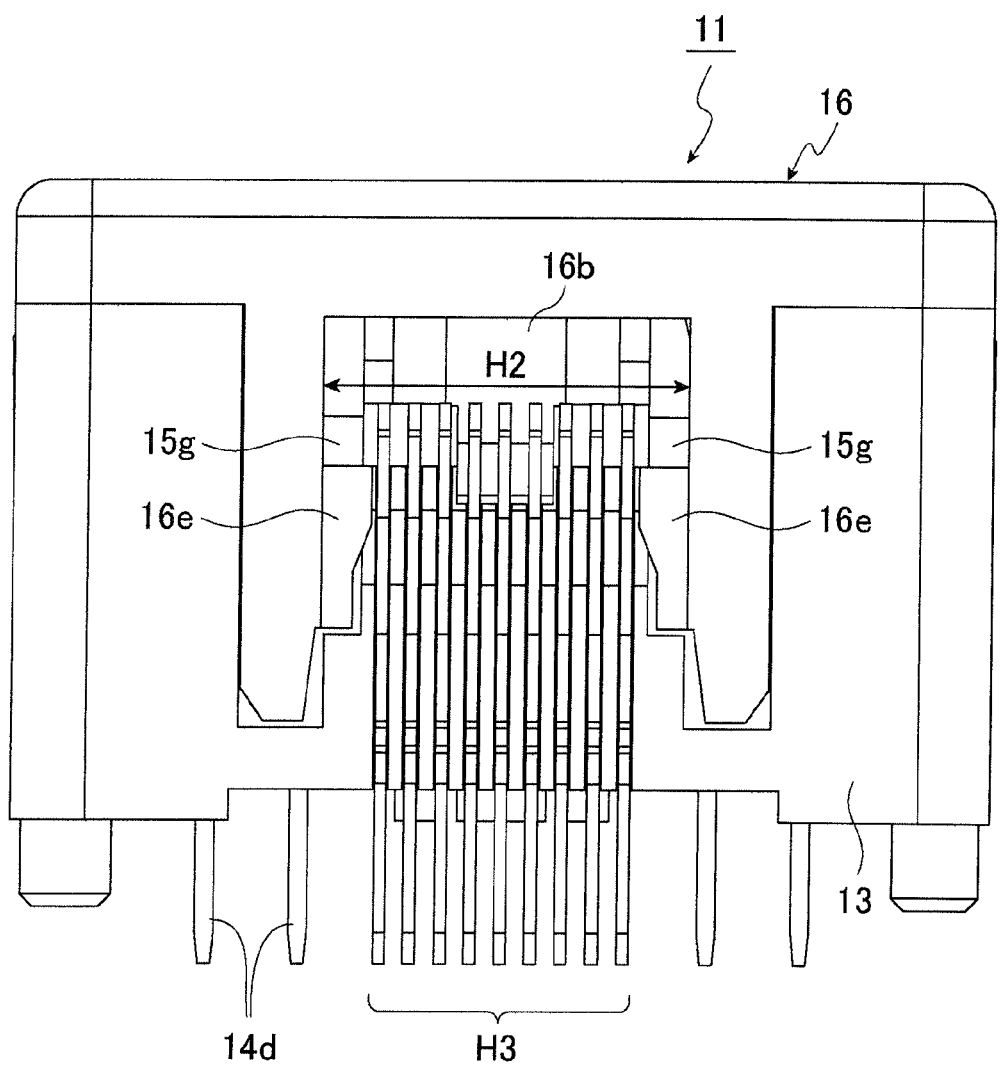
FIG. 9 is a side view of the IC socket showing a state in which the operating member of the IC socket of the present embodiment takes a descending lowermost position thereof.

As shown in FIG. 9, the latches 15 are arranged at four portions with respect to the respective sides of the IC package 12 and positioned above the plural contact pins 14 to be rotatable with respect to the socket body 13. In an operation, when the latches 15 are in closed state, the upper portion of the peripheral edge portion of the IC package 12 is pressed, and when the latches 15 are in opened state, the IC package 12 can be accommodated into or taken out of the accommodation surface portion 13a of the socket body 13.

Figure 10:
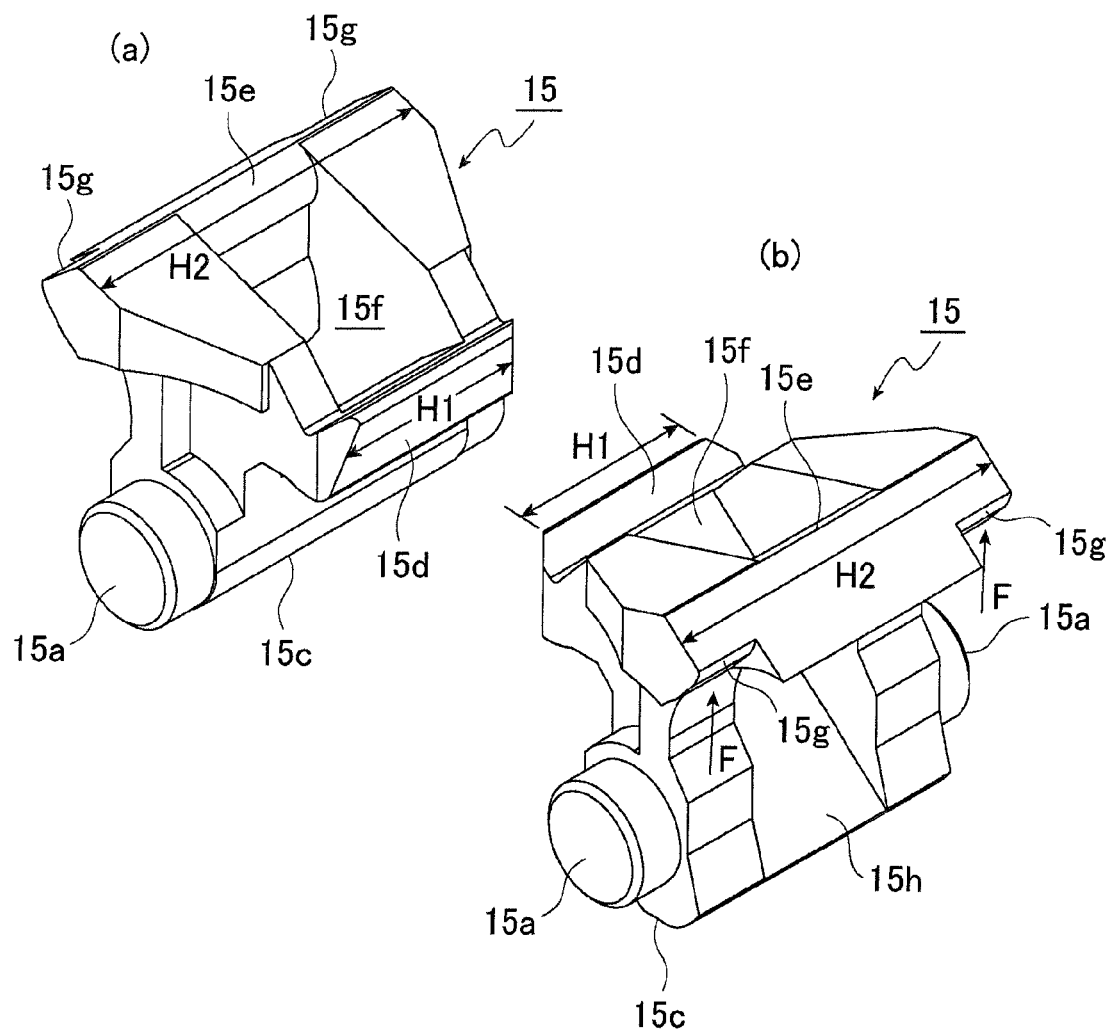
FIG. 10 includes perspective views (a) and (b) showing a latch of the IC socket according to the present embodiment, both being viewed from different directions.

More specifically, as shown in FIG. 10 or others in a plan view, each of the latch 15 has a front end side portion having a narrow width H1 and a rear end side portion having a wide width H2, thus providing a fan-like shape. An opening 15f is formed to a central portion of the fan-shaped portion. Rotation (rotating) shafts 15a are located to the front end side of the latches 15 so as to project in both side directions, and as shown in FIG. 8, both side rotation shafts 15a are clamped and held between the upper side member 13e and the lower side member 13f to be rotatable. The rotation shafts 15a (fulcrum) are positioned below the IC package accommodation surface portion 13a of the socket body 13.

Furthermore, each of the latches 15 is formed with a cam portion 15c as "depressing portion" between a pair of rotation shafts 15a located on both sides on the same axis, and as shown in FIG. 2 showing the left-half side of the latch 15, when the latch 15 is rotated in the opening direction, the elastic piece 14a of the contact pin 14 is pressed by the cam portion 15c and is hence elastically deformed downward, the contact portion 14b is displaced downward so as to be separated in the downward direction from the contacting portion to the terminal 12b of the IC package 12. Likely, as shown in FIG. 2 showing the right-half side of the latch 15 and FIG. 6, when the latch 15 is rotated in the closing direction, the pressing force of the cam portion 15c to the elastic piece 14a is released and the contact portion 14b is displaced upward by the elastic force of the elastic piece 14a to thereby move the contact portion 14b to the contacting portion of the terminal 12b of the IC package 12.

On an opposite side to the cam portion 15c, an inclined surface portion 15h for escape is formed on an extension of the axis of the rotation shaft 15a, and according to such formation of the inclined surface portion 15h, the sectional area is made smaller than the rotation shaft 15a on each of both sides of the latch 15.

Moreover, as shown in FIGS. 2 and 10, for example, the latch 15 is provided with the pressing portion 15d (fulcrum point) pressing the upper surface of the IC package 12, and in addition, an operation portion 15e (point of effort) to be operated for opening which is pressed downward at a descending time of the operating member 16. When the portion 15e to be operated for opening is pressed downward, the latch 15 is rotated in the opening direction.

The operation portion 15e for opening is formed at substantially the central portion on the rear end side, at which the width H2 of the latch 15 is widened, and on the outer edge side of the opening 15f.

Furthermore, a pair of operation portions 15g (points of effort) to be operated for closing are formed so as to project sideway at both end portions of the rear end side at which the width H2 of the latch is widened (see FIG. 10). The paired portions 15g to be operated for closing are formed to positions projecting sideway from the arrangement range width H3 of the contact pins 14 arranged, and according to this arrangement, a distance H2 between the operation portions 15g is widened more than the arrangement range width H3 (for example, see FIG. 9).

Figure 7:
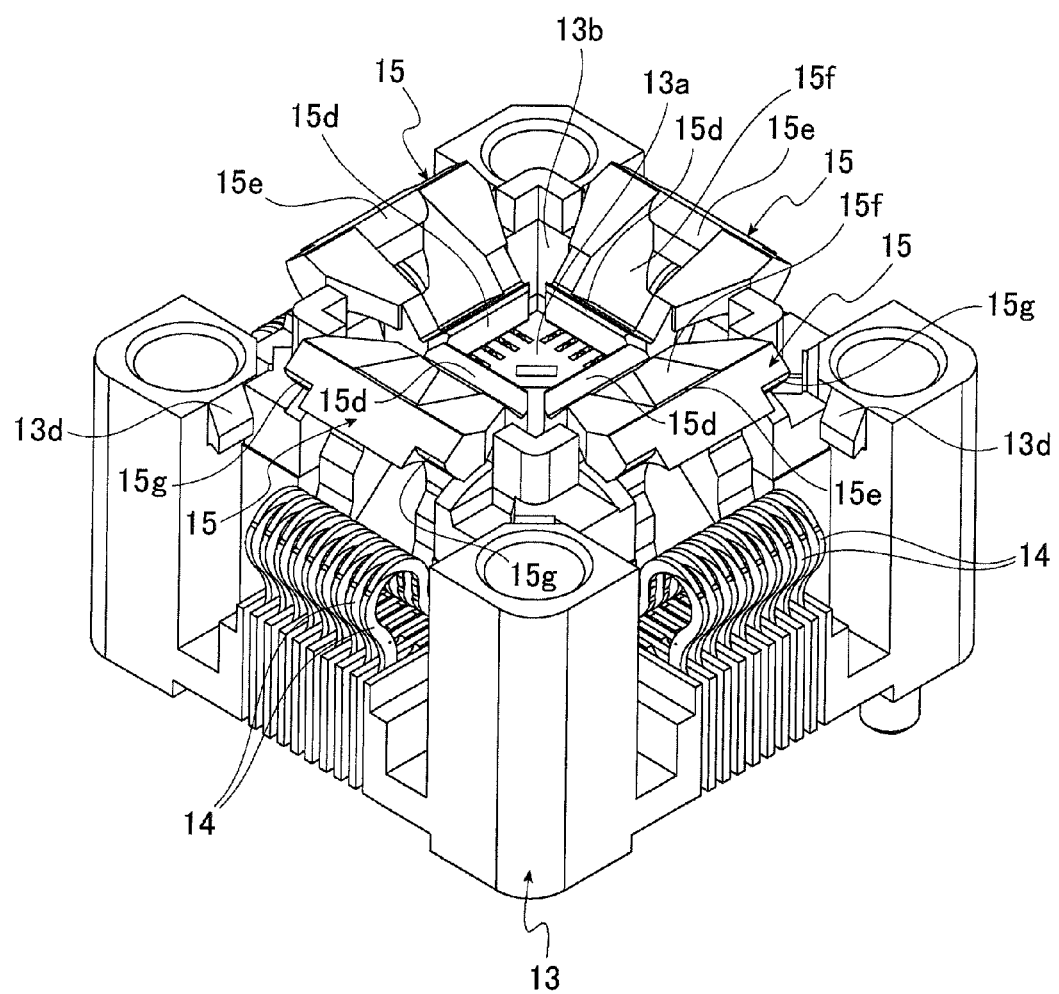
FIG. 7 is a perspective view of the IC socket showing a state in which the operating member of the IC socket according to the present embodiment is removed.
Figure 11:
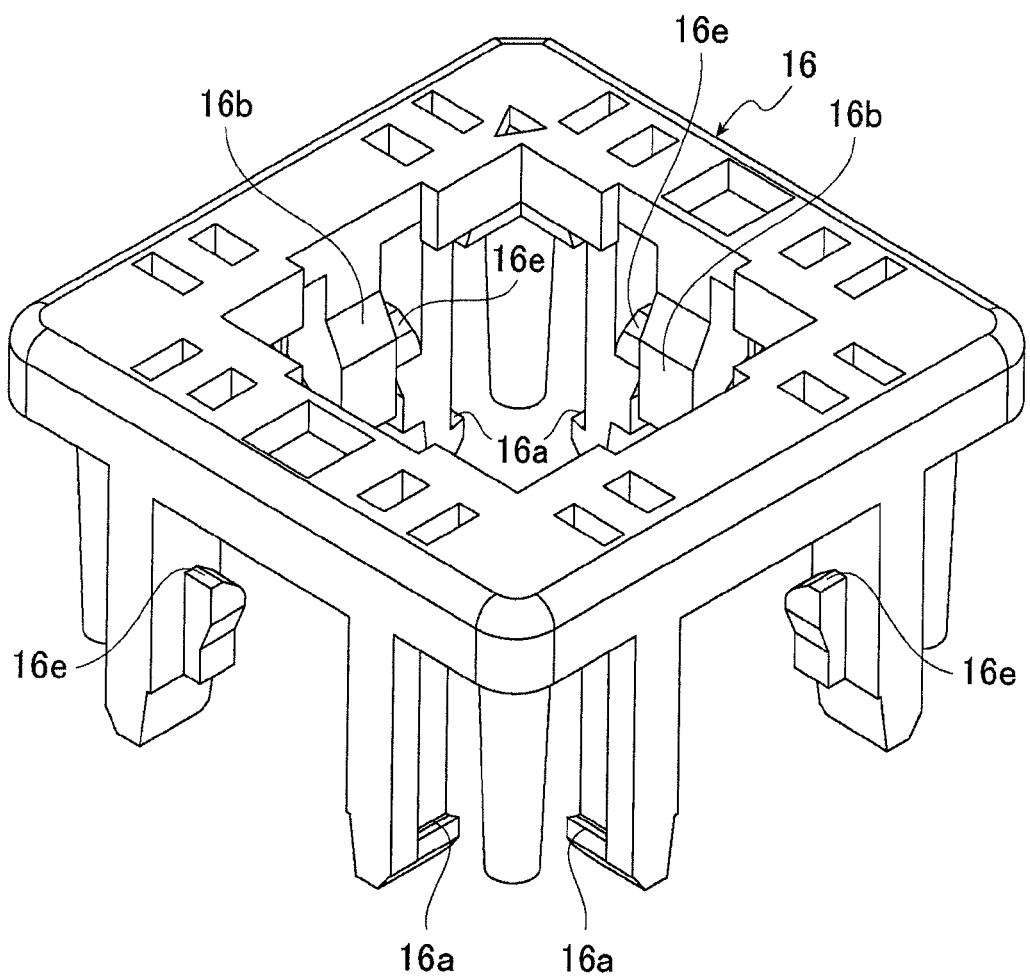
FIG. 11 is a perspective view showing the operating member of the IC socket according to the present embodiment.
Figure 12:
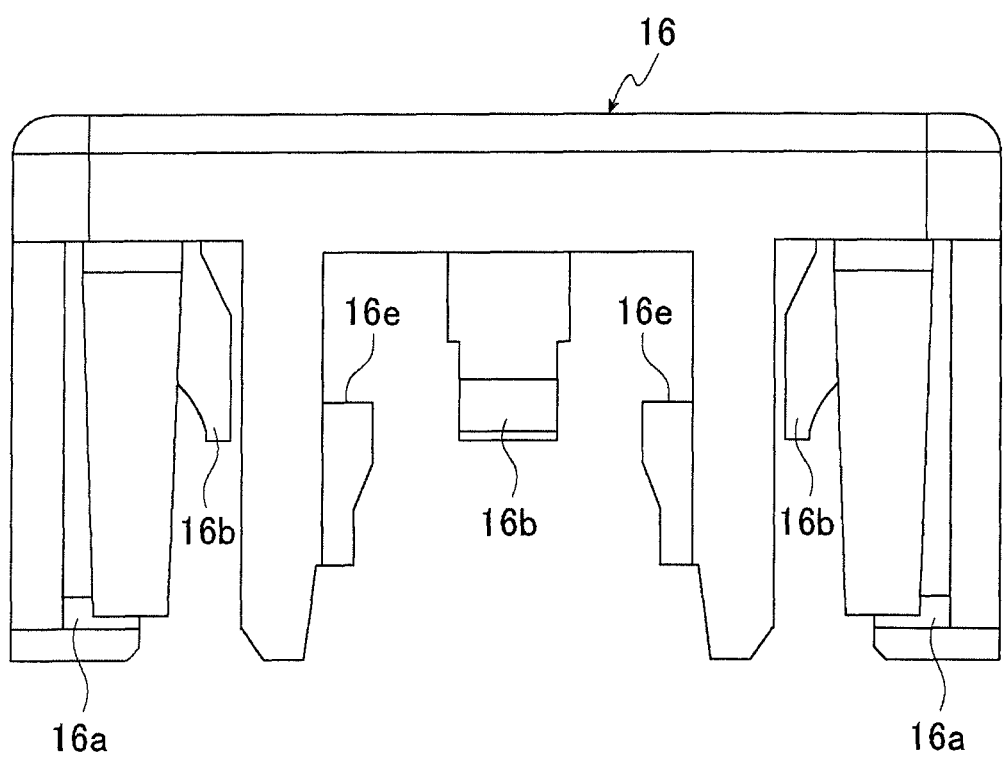
FIG. 12 is a side view showing the operating member of the IC socket according to the present embodiment.
Figure 13:
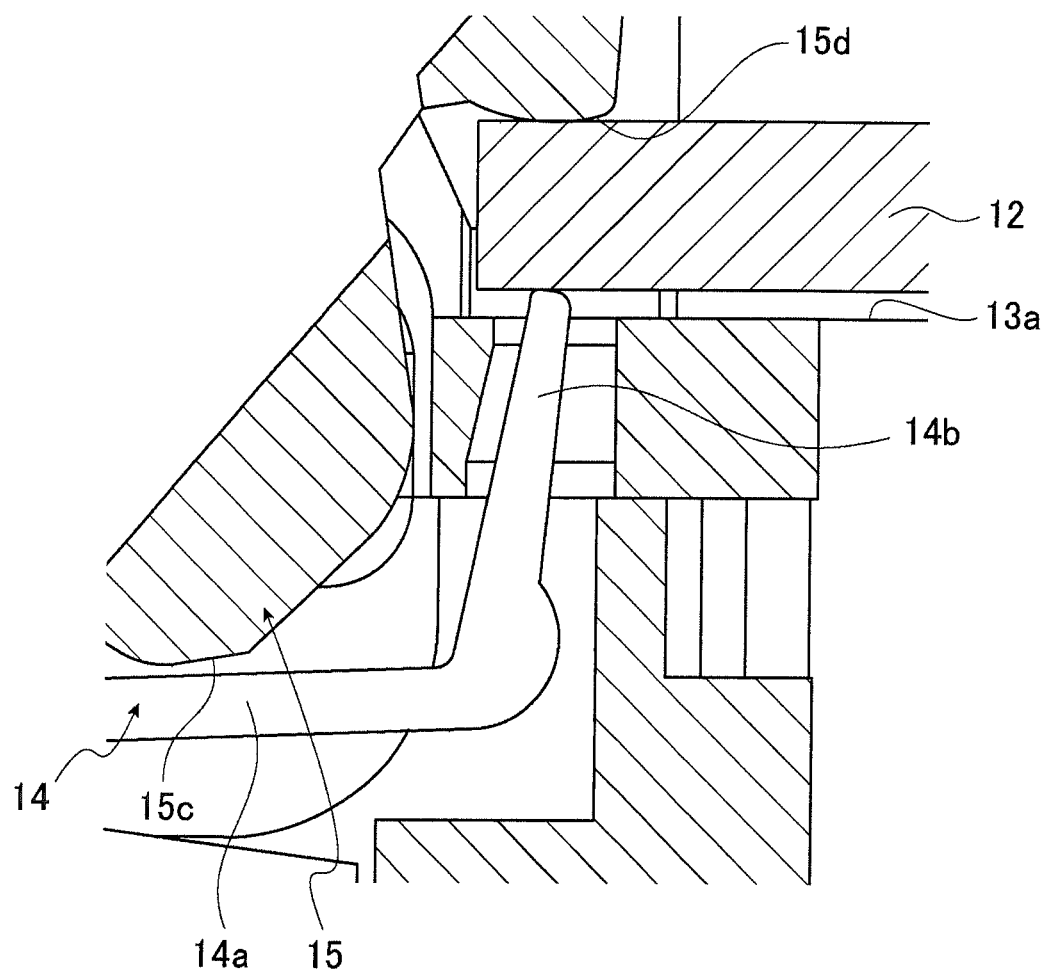
FIG. 13 is a sectional view, in an enlarged scale, showing a state in which the IC package accommodated in the IC socket is slightly pushed upward by a contact pin of the IC socket according to the present embodiment.

Still furthermore, the operating member 16 has a frame-shaped structure in a plan view and is provided for the socket body 13 to be vertically movable. The opening member 16 is urged upward (see FIG. 3) by springs 17 which are disposed at four positions, and as shown in FIG. 7, at the uppermost position, an engaging portion 16a shown in FIG. 11 is engaged with a portion 13d to be engaged (engagement portion 13g) formed to the socket body 13 to thereby restrict the upward movement of the operating member 16.

Furthermore, the operating member 16 is provided with the operating portion 16b for opening which rotates the latch 15 in the opening direction thereof in engagement with the portion 15e to be operated for opening formed to the central portion in the width direction of the latch 15 when the operating member 16 is moved downward from the ascending uppermost position thereof from the state shown in right-half state in FIG. 2 to the left-half state therein. The operating portion 16b for opening is provided for the operating member 16 so as to extend in an extending direction toward the obliquely downward inside the socket body 13.

The operating portion 16b for opening is formed with a slide surface 16c while pressing the portion 15e to be operated for opening of the latch 15 so as to slide on the slide surface 16c is linearly formed as shown in FIG. 2, for example, and when the operating portion 16b for opening of the opening member 16 is moved downward, the operating portion 16b is inserted into the opening portion 15f while pressing downward a portion 15g to be operated for closing of the latch 15.

In the state where the operating member 16 is moved downward to the descending lowermost position and the latch 15 is fully opened, it is set that the front end of the operating portion 16b for opening is inserted into the opening 15f to a position on an extension axis line of the rotation shaft 15a, and a front end surface 16d along the perpendicular direction of the operating portion 16b for opening approximately abuts against the inclined oblique surface portion 15h for escape of the latch 15.

Figure 5:
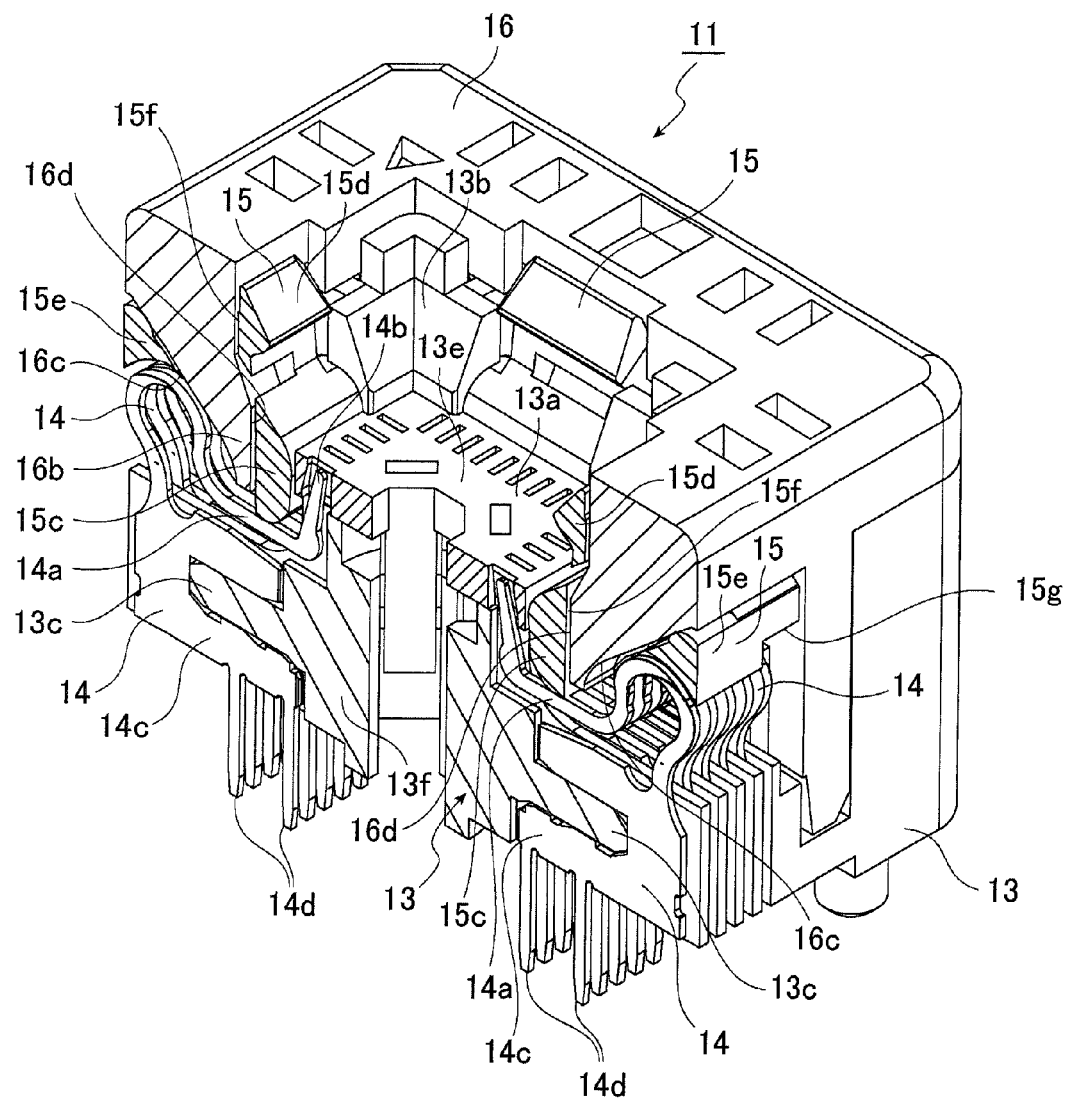
FIG. 5 is a perspective view of the IC socket, partially cut away, showing a state in which the operating member of the IC socket of the present embodiment takes a descending lowermost position thereof.
Figure 6:
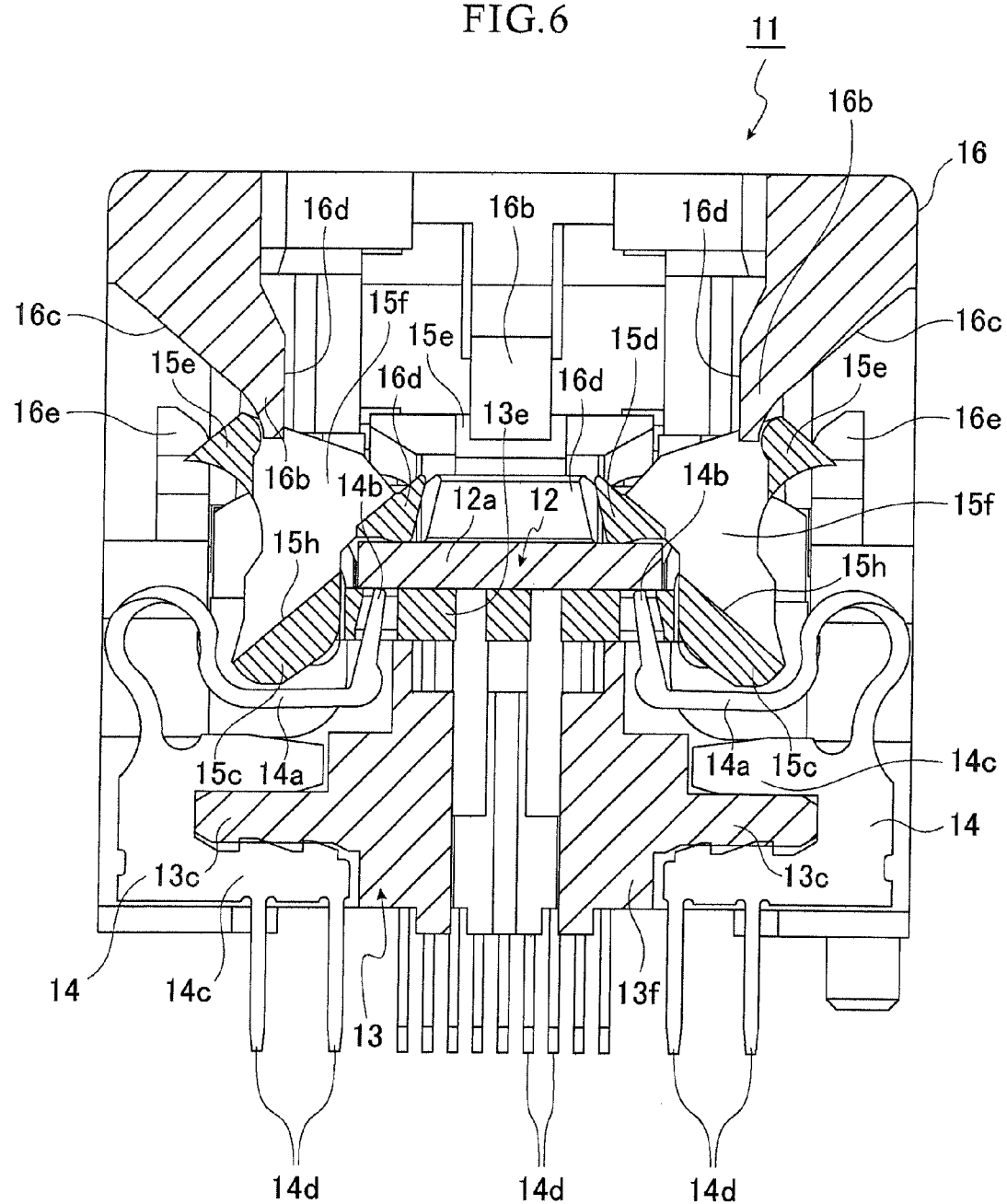
FIG. 6 is a sectional view of the IC socket showing a state in which an IC package of the IC socket of the present embodiment is accommodated in a socket body.

Still further more, as shown in FIG. 5, the operating member 16 is formed with a pair of operating portions 16e for closing, and when the operating member 16 is moved upward from the most lowering position, a pair of portions 15g to be operated for closing of the latch 15 is pressed upward to close the latch 15 by the pair of the operating portions 16e for closing. The operating portions 16e for closing are disposed on both sides of the arranged contact pins 14 and on the inside portion from the most outside portion 14e of the horseshoe-shaped contact pins 14 (see FIG. 2).

Incidentally, the IC socket 11 of the structure mentioned above is not provided with a floating plate which is provided in a conventional structure.

Hereunder, a method of using the IC socket 11 of the structure mentioned above will be explained.

In the following, there will be explained a case in which the IC package 12 is accommodated on the IC socket 11 in a state in which the IC socket 11 is preliminarily fixed to a circuit board.

Figure 4:
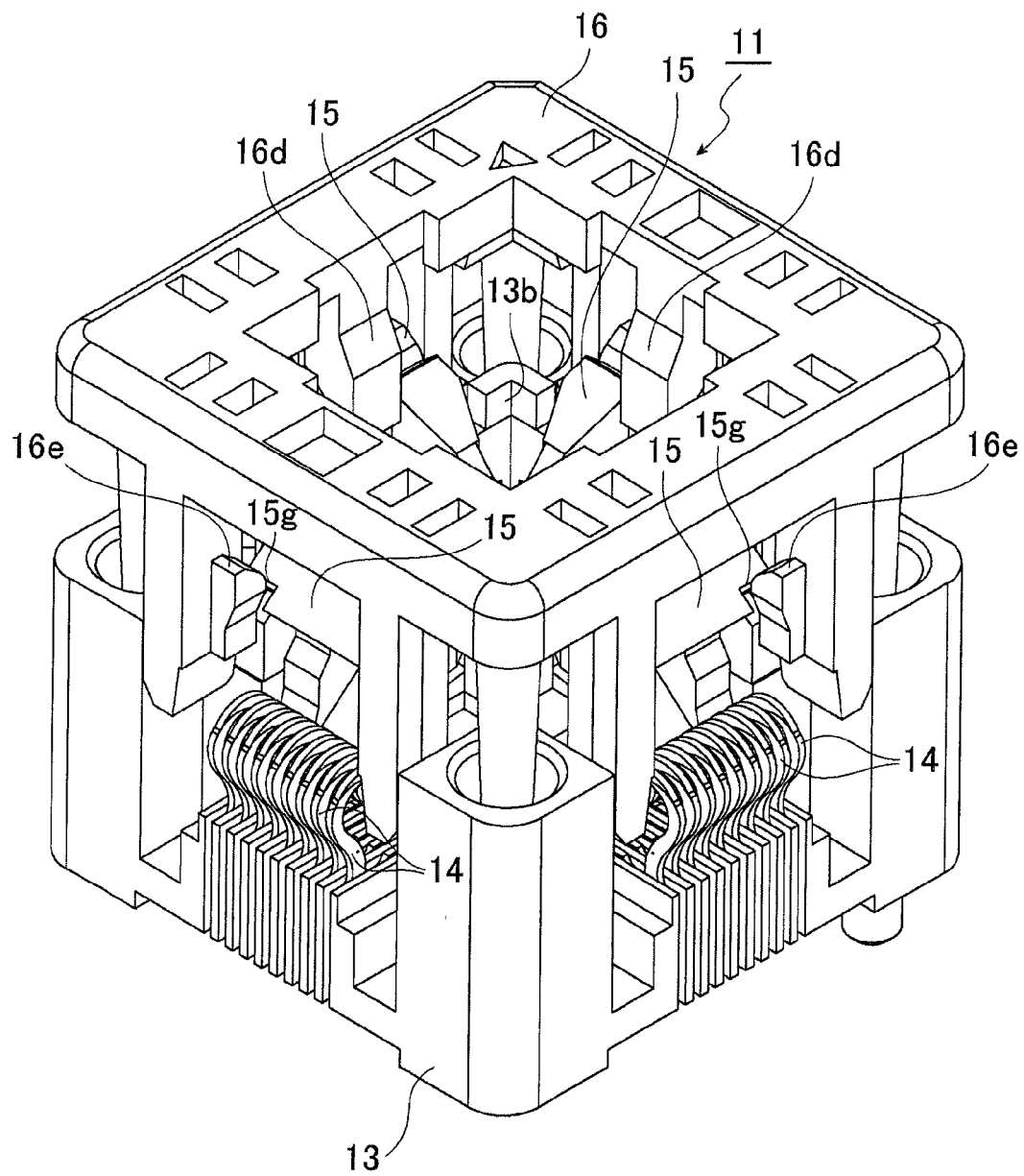
FIG. 4 is a perspective view of the IC socket showing a state in which an operating member of the IC socket of the present embodiment takes an ascending uppermost position thereof.

First, when the operating member 16 is pressed downward against the urging force of the springs 17 from the states shown in right-half in FIG. 2 and FIG. 4, the portions 15e to be operated for opening of the latches 15 are pressed while sliding on the sliding surface 16c of the operating portion 16b for opening of the operating member 16, and the latches 15 are then rotated in the opening direction thereof with the rotation shafts 15a being the center of the rotation. According to this motion, the operating portion 16b for opening of the operating member 16 is deeply inserted into the opening portion 15f of the latch 15, and the pressing portion 15d of the latch 15 is retired from the accommodation/take-out range of the IC package 12 (see left-half side in FIG. 2).

As described above, since there is provided the operating member 16 having the operating portion 16b for opening for rotating the latch 15 in the opening direction thereof by pressing downward the portion 15e to be operated for opening formed to the central portion in the width direction of the latch 15, spaces on both the sides of the latch can be made narrow in comparison with a structure in which the latch is pressed downward by using spaces on both the sides of the latch 15, thus contributing realization of compact outer configuration of the IC socket 11.

Furthermore, the opening portion 15f is formed to the central portion of the latch 15, and when the operating portion 16b for opening of the operating member 16 is moved downward, the operating portion 16b is inserted into the opening portion 15f while pressing downward the portion 15e to be operated for opening formed to the rear side of the opening 15f of the latch 15. According to such structure, the operating member 16 is formed to be further on the inner side of the socket body 13, thus also realizing the compact outer configuration of the IC socket 11.

Still furthermore, as shown in FIG. 2, the operating portion 16b for opening of the operating member 16 is provided with the sliding surface 16c, formed linearly, pressing the portion 15e to be operated for opening of the latch 15 so as to slide on the sliding surface 16c. Accordingly, in comparison with the sliding surface 16c having a curved- or bent-shape, the outer configuration of the operating member can be further made compact with the desired amount of the rotating motion of the latch 15 being ensured.

Still furthermore, the latch 15 is formed with a pair of rotation shafts 15a on both the sides of the opening portion 15f, and in the most lowering position of the operating member 16, the front end portion of the operating portion 16b is inserted to a position of the opening portion 15f on the extension line of the rotation shaft 15a. According to such structure, the operating member 16 is provided to the position further on the inner side of the socket body 13, thus also making compact the outer configuration of the IC socket 11.

In the state in which the latch 15 is opened maximally, the front end portion of the operating portion 16b for opening of the operating member 16 is inserted into the opening portion 15f of the latch 15 deeply to a position on the extension axis line of the rotation shaft 15a, so that the front end surface 16d along the perpendicular direction of the operating portion 16b for opening almost abuts against the inclined oblique surface portion 15h for escape of the latch 15. According to such setting, the outer configuration can be made extremely compact with the amount of rotational motion of the latch 15 being ensured (see left-half side in FIG. 2 and FIG. 5).

A most outside position 15i in a state where the latch 15 is maximally opened takes a position almost not projecting from the most outside portion 14e of the contact pin 14 as shown in the left-half side in FIG. 2, which is different from a conventional structure, and does not project largely outside. Accordingly, the outer configuration of the IC socket 11 can be extremely downsized, thus realizing a compact structure of the IC socket 11.

Furthermore, since the rotation center of the rotation shaft 15a of the latch 15 is positioned below the IC package accommodation surface portion 13a of the socket body 13, the stroke of the latch 15 to the accommodation surface portion 13a can be made longer, so that even if the rotating amount of the latch 15 is small, the IC package 12 can be pressed and/or released by the movement of the pressing portion 15d. Thus, the vertical stroke of the operating member 16 can be made short, and hence, the vertical stroke of the IC socket 11 can be made also short, thus making compact the structure of the operating member 16.

In addition, since the moving amount in the outside direction of the latch 15 can be shortened, the IC socket 11 can be made compact.

Incidentally, according to the rotation of the latch 15, the elastic piece 14a of the contact pin 14 is pressed by the cam portion 15c of the latch 15 and then elastically deformed downward. According to this pressing operation, the contact portion 14b of the contact pin 14 is displaced or biased downward, so that the position of the upper end of the contact pin 14 is lowered to the position below the IC package accommodation surface portion 13a (see left-half side in FIG. 2).

Under the state mentioned above, the IC package 12 is delivered by an automatic machine. Then, the IC package is guided by the guide portions 13b of the socket body 13 and is accommodated to a predetermined position on the IC package accommodation surface portion 13a of the socket body 13 which is not provided with any floating plate.

Thereafter, when the external force, which has applied to the operating member 16, is released, the operating member 16 is moved upward by the urging force of the springs 17, and according to this upward motion of the operating member 16, the portions 15g to be operated for closing of the latches 15 are pushed upward by a pair of the operating portion 16e positioned on both the sides of a plurality of the contact pins 14 and then, the latches 15 are rotated in the closing direction thereof.

As explained above, according to the structure in which the paired operation portions 15g for closing of the latches 15 are formed so as to project on both the sides of the alignment of the plural contact pins 14, and the paired operating portions 16c of the operating member 16 are positioned on both the sides of the alignment of the contact pins 14, it becomes unnecessary to provide a pair of the operating portions 16c of the operating member 16 outside the contact pins 14 (see right-half side in FIG. 2). Thus, in this viewpoint, the outer configuration of the operating member 16, i.e., socket body 13, can be also made compact.

On the other hand, when the latches 15 are rotated in the closing direction, the pressing force by the cam portions 15c of the latch 15 to the elastic pieces 14a of the contact pins 14 is released, the elastic pieces 14a are displaced upward by the elastic force, and the contact portions 14b then contact the terminals 12b of the IC package 12, respectively. According to such motion, the IC package 12 is moved slightly upward from the IC package accommodation surface portion 13a of the socket body 13 by the elastic force of the elastic pieces 14a (see FIG. 13).

Thereafter, the operating member 16 is moved further upward while the latches 15 being closed, and the upper surface of the IC package 12 is thereby pressed downward by the pressing portions 15d of the latches 15.

Figure 14:
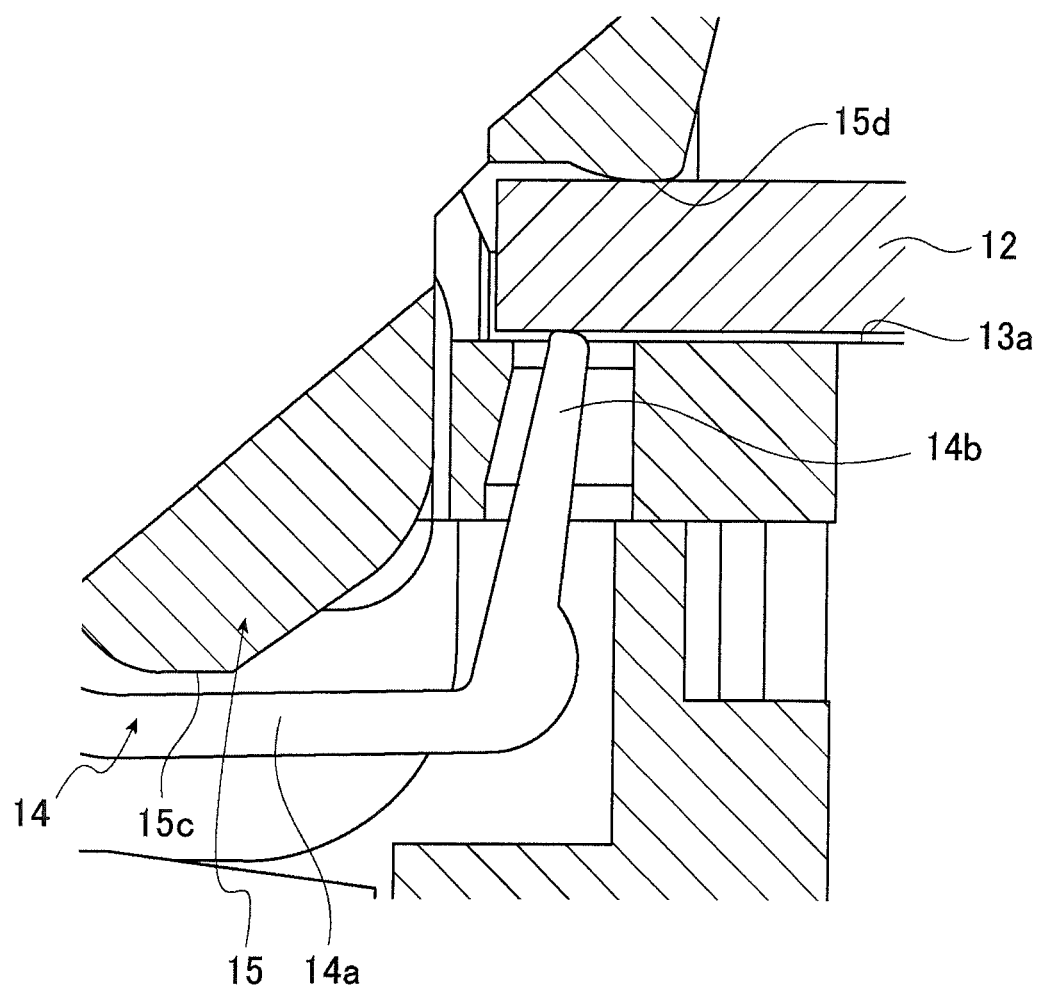
FIG. 14 is a sectional view, in an enlarged scale, showing a state in which the IC package is slightly pressed downward by the pressing force of the latch from the state according to the present embodiment shown in FIG. 13.

Then, as shown in FIG. 14, the IC package 12 is moved slightly downward against the urging force of the elastic pieces 14a of the contact pins 14, and the terminals 12b of the IC package 12 contact the contact portions 14b of the contact pins 12 with a predetermined contacting pressure.

According to such motion, the IC package 12 is electrically connected to the circuit board through the contact pin 14 so as to be ready for performing a burn-in test.

According to the structure of the socket for electric parts mentioned above, when the IC package 12 is accommodated into the IC socket 11, the latches 15 are rotated (pivoted) in the opening direction thereof, thereby displacing downward the elastic pieces 14a of the contact pins 14 by the cam portions 15c, and then displacing upward the elastic pieces 14a after the accommodation of the IC package 12 so that the contact portions 14b of the contact pins 14 contact the terminals 12b of the IC package 12. Accordingly, differing from a conventional structure, any wiping is substantially not caused, and hence, the contacting can be done at pinpoint contact. Therefore, any wiping trail or trace is not almost caused to the terminal 12b of the IC package 12, and in addition, the contact portion 14b of the contact pin 14 can exactly contact to the terminal 12b with no error even in a case of the IC package 12 having extremely narrow width.

Furthermore, since the latch 15 does not substantially slide during the pressing of the latch 15 to the upper surface of the IC package 12, any wiping trail is hardly formed to the upper surface of the IC package 12.

Still furthermore, after the completion of the inspection of the IC package 12, when it is required to take out the IC package 12, the latches 15 are rotated to be opened, and in this time, by forcibly displacing the elastic pieces 14a of the contact pins 14 downward, the contact portions 14b of the contact pins 14 and the terminals 12b of the IC package 12 can be surely prevented from being stuck to each other.

Furthermore, as mentioned above, when the IC package 12 is accommodated onto the accommodation surface portion 13a of the IC socket body 13, the latches 15 are opened. Then, the elastic pieces 14a of the contact pins 14 are elastically deformed by the cam portions 15c, and so the contact portions 14b displaced to positions under the accommodation surface portion 13a. Thereby, the IC package 12 can be accommodated on the predetermined position on the IC package accommodation surface portion 13a.

Thereafter, when the latches 15 are rotated in the closing direction, the pressing force against to the elastic pieces 14a of the contact pins 14 by the cam portions 15c of the latches 15 is released, so that the elastic pieces 14a are displaced upward by the elastic force thereof, the contact portions 14b achieve to positions above the accommodation surface portion 13a, the contact portions 14b contact the terminals 12b of the IC package 12, and by the elastic force of the elastic pieces 14a, the IC package 12 is slightly moved upward from the accommodation surface portion 13a of the socket body 13. Successively, the operating member 16 is further moved upward and the latch 15 is further closed, then the upper surface of the IC package 12 is pressed downward by the pressing portion 15d of the latch 15, and so the IC package 12 is slightly lowered against the urging force of the elastic pieces 14a of the contact pins 14, whereby the terminals 12b of the IC package 12 and the contact portions 14b of the contact pins 14 are contacted to each other with a predetermined contacting pressure.

According to the configuration mentioned above, it is not necessary to vertically move the seating surface (accommodation surface portion 13a) of the IC package 12, in other words, it is not necessary to locate any floating plate. Thus, the pushing amount of the IC package 12 by the pressing portion 15d of the latch 15 can be made small, and accordingly, a distance from the rotating center (pivot center) of the latch 15 to the pressing portion 15d thereof can be shortened, and the latch 15 can be hence made compact, resulting in realization of the compact IC socket 11.

Still furthermore, since it is not necessary to locate the floating plate, the number of parts to be arranged can be reduced. Accordingly, tolerance of each of parts or components can be made small. Additionally, vibrations in the lateral direction on a plane, which occurs in the case the floating plate is used, can be prevented. Thus, the IC package 12 can be arranged to a predetermined position more precisely.

Moreover, since the latch has so-called a fan-like shape having a front end side (inside) having a narrow width H1 and a rear end side (outside) having a wide width H2, and a center side (portion 15e to be operated for opening) is constructed for an opening portion, and both end sides (portions 15g to be operated for closing) are constructed for closing portions, it is not necessary to form or provide a structure for opening/closing the latch in a space on the rear side of the latch 15, thereby making further compact the entire outer configuration of the IC socket 11.

Still furthermore, since the clamping portions 14c of the contact pins 14 can be provided to be detachable to the mount portion 13c of the socket body 13 from the transverse side of the socket body 13, operation workings such as exchanging working can be extremely easily done.

Still furthermore, the portions 15e to be operated for opening of the latches 15 are arranged at the central portions in the width direction thereof so that these portions 15e are opened by the pressing of the operating portions 16b of the operating member 16, and accordingly, the latches 15 can perform the opening and/or closing operation in a balanced state only by pressing one portion of the operating member 16.

Further, it is to be noted that in the above described embodiment, although the present invention is applied to the IC socket 11 as "socket for electric parts", the present invention is not limited to this application and is applicable to other devices and the like. In addition, it is also to be noted that the pressing portion of the latch may be formed to have various shapes without being limited to the cam portion.

EXPLANATION OF REFERENCE NUMERALS

11—IC socket (socket for electric parts)
12—IC package (electric parts)
12b—terminal
13—socket body
13a—accommodation surface portion
14—contact pin
14a—elastic piece
14b—contact portion
14e—outermost position
15—latch
15a—rotation shaft
15b—receiving portion
15c—cam portion
15d—pressing portion
15e—portion to be operated for opening
15f—opening portion
15g—portion to be operated for closing
15h—inclining surface portion for escape 15*i*—outermost position
16—operating member
16*b*—operating portion for opening
16*c*—sliding surface
16*d*—front end surface
16*e*—operating portion for closing
H1—width
H2—width
H3—arrangement range width

The invention claimed is:

1. A socket for electric part comprising:
a socket body that accommodates an electric part having a lower surface and a terminal provided to the lower surface;
a contact pin provided for the socket body and formed with an elastic piece comprising a contact portion to contact the terminal of the electric part when the electric part is accommodated in the socket body; and
a latch which is rotatable about a rotation shaft and configured to press the electric part, when the electric part is accommodated in the socket body, from an upper side of the socket body, wherein
the elastic piece of the contact pin is extended substantially along a horizontal direction,
the latch includes a pressing portion and a depressing portion integrally formed together,
when the latch is rotated in an opening direction and the electric part is accommodated in the socket body, the elastic piece is pressed downward by the depressing portion of the latch so as to be elastically deformed downward so that the contact portion is displaced downward so as to be separated downward from a contacting position to the terminal of the electric part, and
when the latch is rotated in a closing direction and the electric part is accommodated in the socket body, the electric part is pressed by the pressing portion from an upper side to thereby release a pressing force of the depressing portion of the latch applied to the elastic piece so as to displace the elastic piece upward by the elastic force of the elastic piece to thereby contact the terminal of the electric part.

2. The socket for electric part according to claim 1, wherein
the latch comprises a pair of rotation shafts disposed along a same axis, to thereby provide said rotation shaft about which the latch is rotatable, and
the depressing portion of the latch is a cam portion provided between the rotating shafts.

3. A socket comprising:
a socket body that accommodates an electric part including a terminal;
a contact pin provided for the socket body and formed with an elastic piece comprising a contact portion to contact the terminal of the electric part when the electric part is accommodated in the socket body; and
a latch which is rotatable about a rotation axis and configured to press the electric part, when the electric part is accommodated in the socket body, from an upper side of the socket body, wherein
the latch includes a pressing portion and a depressing portion integrally formed together,
when the latch is rotated in an opening direction and the electric part is accommodated in the socket body, the elastic piece is pressed downward by the depressing portion of the latch so as to be elastically deformed downward so that the contact portion is displaced downward so as to be separated downward from a contacting position to the terminal of the electric part, and
when the latch is rotated in a closing direction and the electric part is accommodated in the socket body, the electric part is pressed by the pressing portion from an upper side to thereby release a pressing force of the depressing portion of the latch applied to the elastic piece so as to displace the elastic piece upward by the elastic force of the elastic piece to thereby contact the terminal of the electric part.

4. The socket according to claim 1, wherein
the latch comprises a pair of rotation shafts disposed along the rotation axis, and
the depressing portion of the latch is a cam portion provided between the rotating shafts.

* * * * *